(12) United States Patent
Baron et al.

(10) Patent No.: US 7,193,428 B1
(45) Date of Patent: Mar. 20, 2007

(54) LOW THRESHOLD CURRENT SWITCH

(75) Inventors: Mike Baron, Aloha, OR (US); Jim Bernklau, Tigard, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 11/336,170

(22) Filed: Jan. 19, 2006

(51) Int. Cl.
*G01R 31/36* (2006.01)
*G01R 31/08* (2006.01)
*G01R 1/02* (2006.01)

(52) U.S. Cl. .................. 324/771; 324/158.1; 324/522; 340/664; 361/93.1; 361/87

(58) Field of Classification Search ............... 324/771
See application file for complete search history.

(56) References Cited

U.S. PATENT DOCUMENTS 4,558,310 A * 12/1985 McAllise .................. 340/661
2006/0164096 A1 * 7/2006 Kwon ....................... 324/522

* cited by examiner

*Primary Examiner*—Ha Tran Nguyen
*Assistant Examiner*—Emily Y Chan
(74) *Attorney, Agent, or Firm*—Chernoff, Vilhauer, McClung & Stenzel

(57) ABSTRACT

Low threshold current switch comprising a sensing transformer, a voltage multiplier and a switch enables monitoring a very low electric current in a power cable.

14 Claims, 3 Drawing Sheets

LOW THRESHOLD CURRENT SWITCH

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to a current switch for monitoring low levels of electric current in a conductor.

Electrical devices that draw very limited current, often only a small fraction of an amp, are used in large numbers in many industrial and residential environments. The operation of these devices, such as small fan motors and heaters, can be important to the protection of valuable property or successful completion of a process that may involve costly or hazardous equipment or materials. These devices may be stand-alone devices controlled by a local controller, but are often components of an automated system that are monitored and operated by a remotely located controller or building management computer. Typically, the operation of the device is tracked by a monitoring device, such as a current switch, that includes by a current sensor that is electromagnetically coupled to a cable supplying power to the electrical device or load. The current sensor outputs a signal that is representative of the status of the current within the cable and, if the current changes significantly, a signal is transmitted to the controller. The controller may display a warning or an advisory signal on a control panel for a human operator and/or selectively enable or disable power to the load or another load(s) in response to the signal.

Holce et al., U.S. Pat. No. 5,808,846, incorporated herein by reference, disclose a protection device comprising a combination current sensor and relay for monitoring current in a cable supplying power to a load and controlling a device in response to a signal from a remotely located control panel. The protection device includes a sensing transformer comprising a wire wound core that encircles the power cable. A changing current in the power cable produces a changing electro-magnetic field around the cable which, in turn, induces a magnetic flux in the core of the sensing transformer. The magnetic flux in the core induces a voltage in the wire windings that is representative of the current flowing in the power cable. Thus, the power cable is the primary winding and the wire winding is the secondary winding of the sensing transformer. The wire winding is electrically connected to an input circuit that converts the voltage signal received from the secondary winding of the sensing transformer to an output signal representative of the current flowing in the power cable. The output signal is transmitted to a control panel and analyzed to determine if the controlled device is to be disabled or enabled. The control panel transmits an appropriate signal to a switch circuit, typically comprising a triac or relay, which responds to the signal from the control panel by shorting or isolating electrical terminals in series with the controlled device.

While the protection device disclosed by Holce et al. is compact and easy to install, it functions best with devices that draw substantial current. The current sensing input circuit is powered by energy sourced from the power cable through the wire winding of the sensing transformer. If the power cable current is too low, there may be insufficient energy to power the passive input circuit making current monitoring unreliable. For a protection device having a solid core sensing transformer and an input circuit of the type described by Holce et al., a minimum current of approximately 0.5 amps is required to generate sufficient flux to power the input circuit. The current draw of many electrical devices, including fractional horsepower motors, is insufficient for reliable detection with this type of sensing circuitry. What is desired, therefore, is a device for detecting very small currents flowing in electrical conductors.

DETAILED DESCRIPTION OF THE INVENTION

Figure 1:
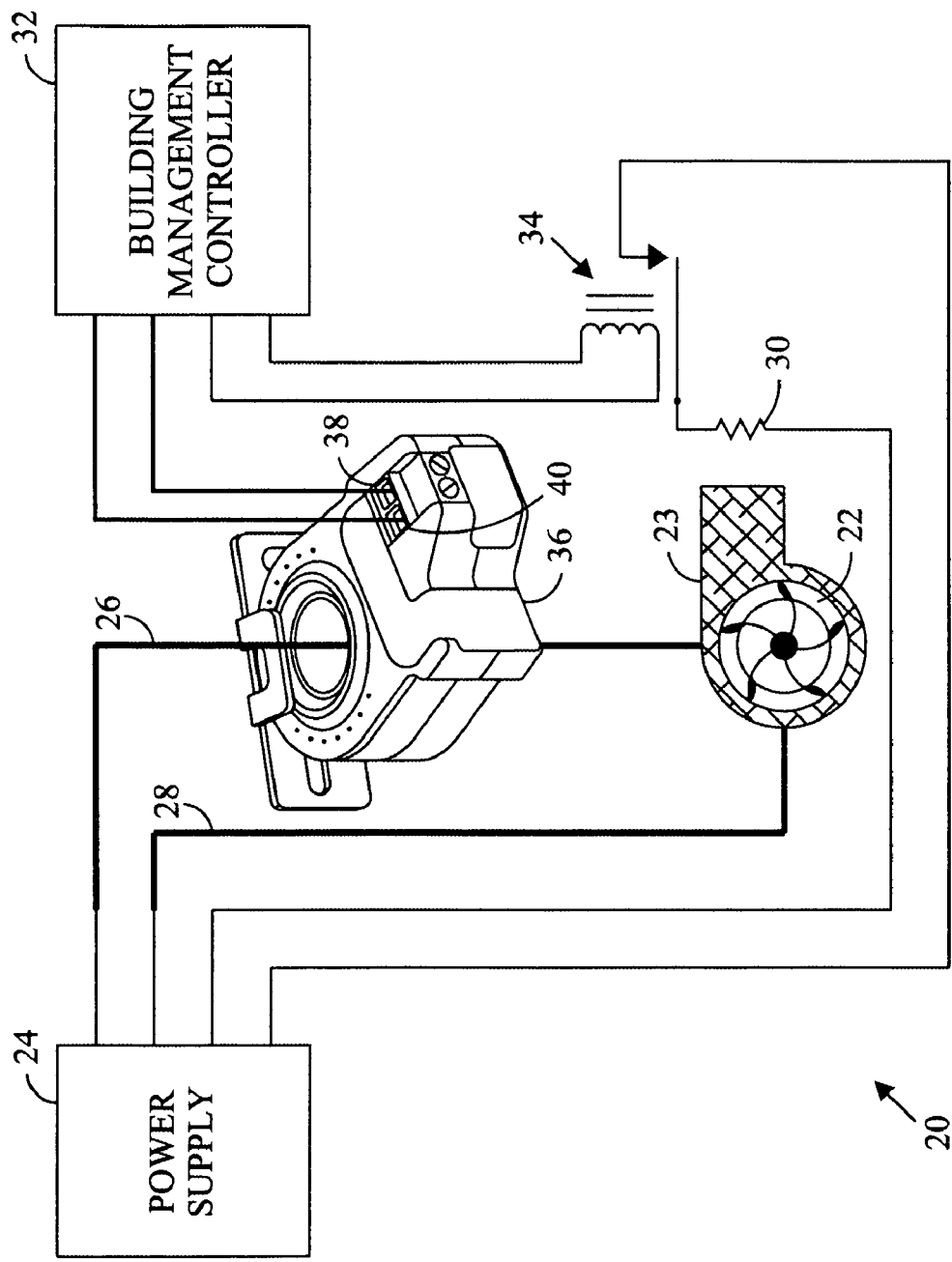
FIG. 1 is a schematic representation of an exemplary electrical system including a current switch arranged to monitor current in a power cable.

Referring in detail to the drawings where similar parts are identified by like reference numerals and referring more particularly to FIG. 1, an exemplary electrical system 20 includes an electrical load 22 that is connected to a power supply 24 by power cables 26, 28. By way of examples, loads may include valves, heaters, relays, lights, and motors that drive pumps, fans, etc. In the exemplary system, the load comprises a motor 22 that drives a fan 23 to force air over a heater 30 that is to operate only when the fan operating. The operation of the heater of the exemplary system is controlled by a relay 34 which, in turn, is controlled by a building management controller 32. A current switch 36 monitors the current flow in the power cable 26. When the fan motor 22 is running and current is flowing to the fan motor in the power cable 26, the current switch provides a first signal at the terminals 38, 40 which are conductively connected to the controller. When the current flow in the power cable 26 ceases, the current switch 36 provides a second signal at the terminals and the controller, responsive to instructions in its program, causes the relay 34 to open disconnecting the heater.

Figure 2:
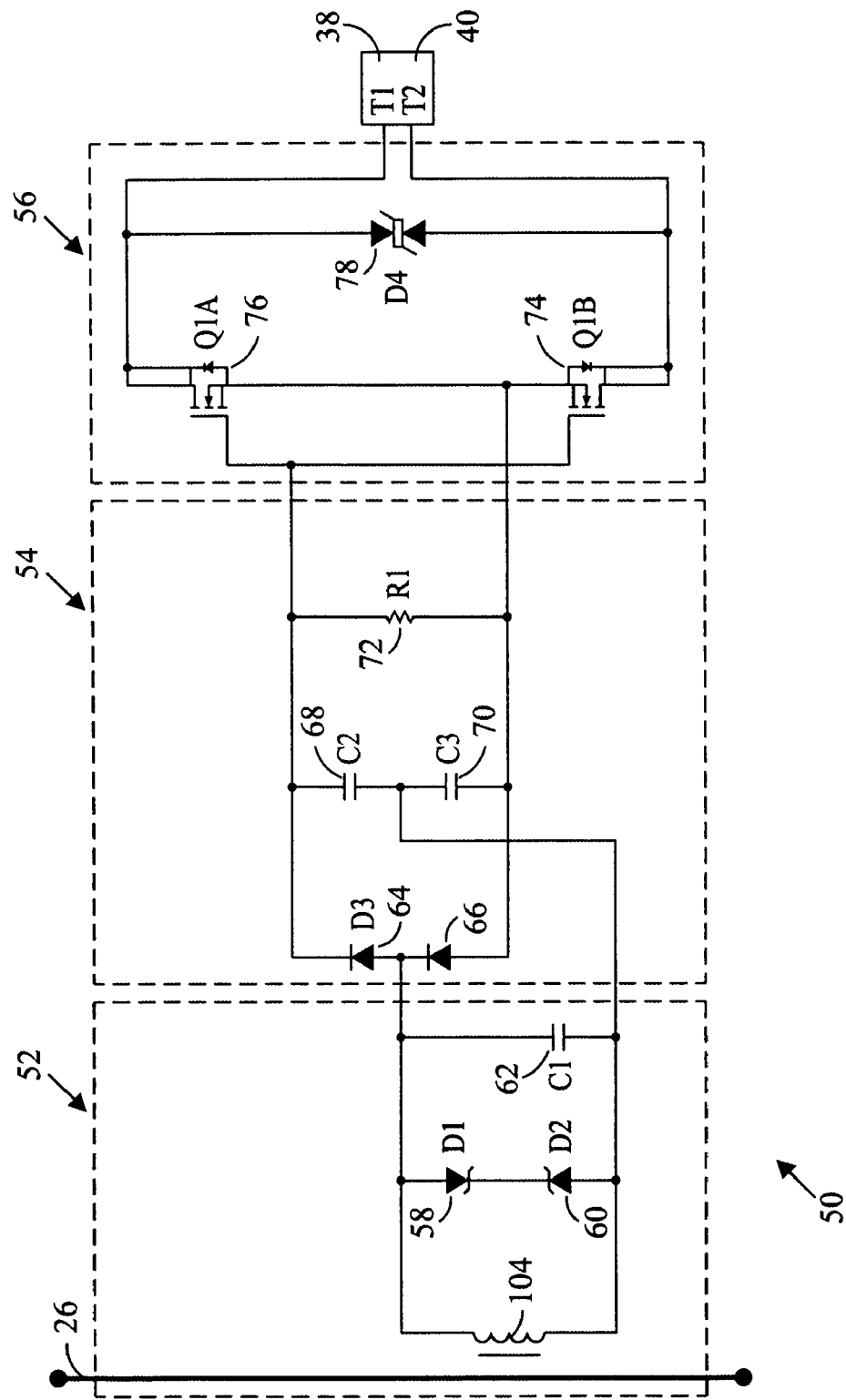
FIG. 2 is a schematic representation of a low threshold current switch.
Figure 3:
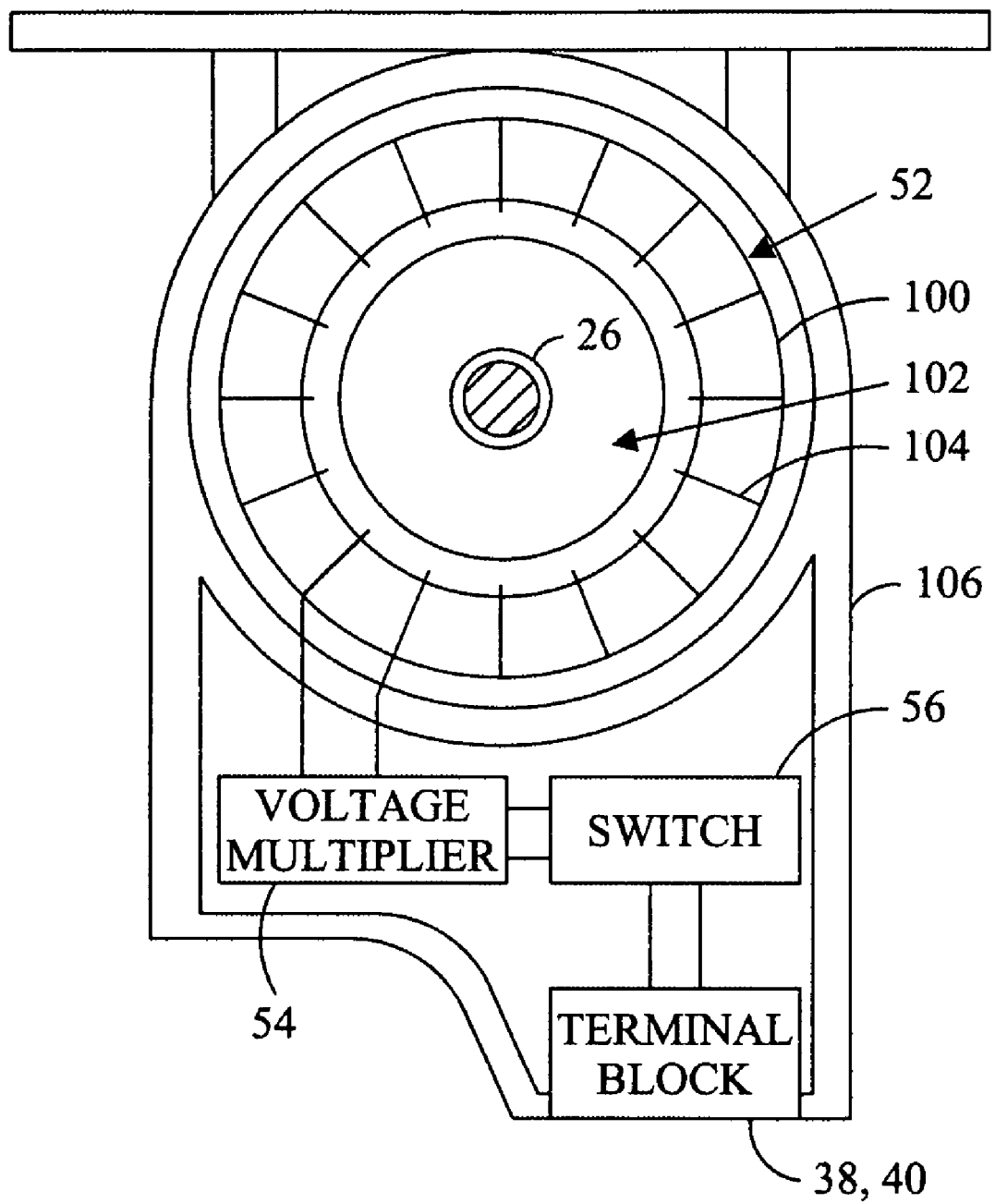
FIG. 3 is a block diagram of a low threshold current switch.

Referring to FIG. 2, the current switch 50 comprises a sensing transformer 52, a voltage multiplier 54, and a switch 56. Referring to FIG. 3, the sensing transformer 52 comprises preferably a wire-wrapped magnetically permeable toroidal core 100, normally made of iron that is typically contained within a protective housing 106. The power cable in which the current is to be monitored, for example, power cable 26, is routed through the central aperture 102 in the toroidal core. The core of the sensing transformer may be a solid toroid or, for easier installation on attached power cables, may be a split toroid, as described by Cota, U.S. Pat. No. 5,502,374, incorporated herein by reference. Changes in the current flowing in the power cable 26 produce a variable electromagnetic field around the cable which, in turn, induces a magnetic flux in the magnetically permeable core 100 of the transformer. The magnetic flux in the core, in turn, induces a voltage in the wire 104 that is wound around one of the portions of cross-section of the toroidal core. The power cable 26, or a parallel shunt current divider (not shown), routed through the aperture in the core is the primary winding and the wire winding 104 on the core is the secondary winding of the transformer. The voltage induced in the secondary winding is representative of the current in the power cable.

An exemplary sensing transformer has the following construction: core material made by Arnold Engineering, of Norfolk, Neb., of 0.012 silectron, 3% silicon steel, grain oriented, with an outside diameter of 1.375 inches, an inside diameter of 1.125 inches, strip width of 0.500 inches, strip thickness of 0.012 inches, an epoxy powder coating of 0.010 to 0.030 inches thick, a nylon overcoat wound on the metal core, and a #33 AWG size wire coated with a heavy polyurethane.

A sensing transformer with a core of magnetically permeable material, such as iron, generates a voltage signal that reasonably accurately represents the current in the power cable over a certain normal load range. However, iron and other magnetically permeable materials have hysteresis and other nonlinear responses to changing magnetic fields that result in a nonlinear relationship between current in the power cable and the voltage signal produced in the secondary winding of the transformer. The nonlinearity of such responses is especially significant with large variations in load current and frequency. To provide a more linear measurement of power, "air core" transformers have been designed using wire wrapped on a core made of material having a low magnetic permeability, such as one of plastic or nylon. Without a magnetically permeable core, however, the transformer winding generates relatively lower voltage levels in response to a particular power cable current. An exemplary air core transformer has the following construction: core of nylon, outside diameter of 1.375 inches, inside diameter of 1.125 inches, strip width of 0.500 inches, and having a secondary winding comprising 4,000 turns of #35 AWG wire with a heavy polyurethane coating and wound as a secondary winding. Examples of circuitry suitable for use with an "air core" transformer are disclosed in U.S. Pat. No. 5,502,374 assigned to Veris Industries, Inc.

A diode clamp, comprising a pair of zener diodes 58, 60 connected in series with opposing forward biases and collectively connected in parallel with the secondary winding, and a resonating capacitor 62 provide signal conditioning for the output of the secondary winding 104. The capacitor 62 is connected in parallel with the secondary winding and is selected to resonate with the secondary winding at 50–60 Hz, the expected frequency of the alternating current in the power cable 26. The resonant circuit, comprising the resonating capacitor and the secondary winding, increases the amplitude of the voltage signal at frequencies adjacent to the resonant frequency and interferes with signals having frequencies remote to the resonant frequency providing a more distinct, higher amplitude voltage signal at the output of the secondary winding and lowering the current threshold of the sensing transformer. Resonance can be optimized at a low current threshold because the inductive reactance of the secondary winding varies with power level while the capacitor produces little effect at higher power levels. The capacitor 62 also smoothes the secondary winding voltage by charging during the portion of the electrical cycle where the voltage is increasing and discharging during the portion of the cycle when the voltage is decreasing reducing the difference between the maximum and minimum voltages of the periodic voltage signal waveform.

The diode clamp controls voltage excursions in the secondary winding to protect the switch 56 from over-voltage and increase the operating range of the current switch. The Zener diodes of the diode clamp limit the voltage in the secondary winding resulting from inrush current at start up or when operating at higher power cable currents, to protect the FETs of the switch 56. While capable of sensing very low levels of power cable current, exemplary current switches can be operated with power cable currents up to 200 amps. The Zener diodes provide a convenient clamping circuit and the low reverse voltage leakage of the diodes enables a lower switching threshold for the current switch, but other clamping circuits could be used to control the sensing transformer output.

The voltage signal output by the sensing transformer 52 is input to a voltage multiplier 54. The voltage multiplier effectively comprises two half-wave rectifiers in series, each rectifier comprising a diode and a capacitor in series with the secondary winding of the sensing transformer. During the positive half-cycle diode 64 conducts and charges the capacitor 68 and during the negative half-cycle the second diode 66 conducts to charge the second capacitor 70. While additional stages might be incorporated in the voltage multiplier to further amplify the voltage signal, the amplified voltage signal at the output of the single stage voltage multiplier 54 is equal to twice the voltage at the input to voltage multiplier. To further reduce the threshold of the current switch, diodes exhibiting minimal forward voltage drop, such as Schottky type diodes, are preferable for the voltage multiplier. A resistor 72, in parallel with the capacitors of the voltage multiplier 54 functions as a fixed load to controllably discharge the capacitors 68, 70 in a predetermined period.

When current is flowing in the power cable 26, the sensing transformer 52 generates a voltage signal that is multiplied and rectified by the voltage multiplier 54. The amplified voltage at the output of the voltage multiplier is conducted to the gates and sources of the switch transistors 74, 76 to enable conduction between the respective sources and drains of the switch transistors. The terminals of the current switch, T1 38 and T2 40, conductively connected, respectively, to the drains of the switch transistors, are shorted producing a first signal to a controller or other device conductively connected to the terminals. A current less than 0.25 amps flowing in a conductor can be detected by the low threshold current switch causing the first signal to be output at the current switch terminals. Testing has demonstrated that the low threshold current switch utilizing a solid toroidal core sensing transformer can be used to detect currents less than 0.15 amps and utilizing a split core sensing transformer can be used to detect currents less than 0.10 amps. If there is no current flowing in the power cable 26, no voltage is induced in the secondary winding 104 of the sensing transformer 52 and conduction between the sources and drains of the switch transistors 74, 76 is blocked producing a second signal to the attached controller or device, an open circuit between the terminals T1 38 and T2 40.

The lower current detection threshold of the low threshold current switch enables use of current switches in conjunction with loads having substantially lower current draw than could be detected by prior current switches.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A device for monitoring electric current in a power cable comprising:
   (a) a sensing transformer having a secondary winding electromagnetically coupled to said power cable and producing a voltage signal when a current is present in said power cable;
   (b) a voltage multiplier to amplify said voltage signal;
   (c) a switch having a first terminal and a second terminal, said switch responsive to said amplified voltage signal to enable conduction between said first and said second terminals and disable conduction between said first and second terminals when current is not present in said power cable;
   (d) a first Zener diode having a first forward bias; and
   (e) a second Zener diode having a second forward bias and connected in series with said first Zener diode with said second forward bias opposing said first forward bias, said first and said second Zener diodes connected in parallel with said secondary winding.

2. The device for monitoring current of claim 1 wherein said sensing transformer further comprises:
   (a) a diode clamp to limit excursions of said voltage signal; and
   (b) a capacitor connected in parallel with said secondary winding and selected to resonate with said secondary winding.

3. The device for monitoring current of claim 2 wherein said capacitor is selected to resonate with said secondary winding at a frequency of an alternating electric current expected in said power cable.

4. The device for monitoring current of claim 1 wherein a magnitude of said amplified voltage is twice a magnitude of said voltage signal.

5. The device for monitoring current of claim 1 wherein said switch is responsive to said amplified voltage signal to enable conduction between said first and said second terminals when a current of 0.25 amperes and greater is present in said power cable.

6. The device for monitoring current of claim 1 wherein said switch is responsive to said amplified voltage signal to enable conduction between said first and said second terminals when a current of 0.14 amperes and greater is present in said power cable.

7. The device for monitoring current of claim 1 wherein said switch comprises:
   (a) a first transistor having a first gate conductively connected to receive said amplified voltage signal and a first drain; and
   (b) a second transistor having a second gate conductively connected to said first gate and a second drain, conduction between said first drain and said second drain being enabled by said amplified voltage signal.

8. The device for monitoring current of claim 7 wherein conduction between said first drain and said drain is enabled when a current of 0.25 amperes and greater is present in said power cable.

9. The device for monitoring current of claim 7 wherein conduction between said first drain and said drain is enabled when a current of 0.14 amperes and greater is present in said power cable.

10. A device for monitoring electric current in a power cable comprising:
    (a) a sensing transformer having a secondary winding electromagnetically coupled to said power cable and producing a voltage signal when a current is present in said power cable;
    (b) a voltage multiplier to amplify said voltage signal;
    (c) a switch having a first terminal and a second terminal, said switch responsive to said amplified voltage signal to enable conduction between said first and said second terminals and disable conduction between said first and second terminals when current is not present in said power cable;
    (d) a first diode and first capacitor conductively connected in series with said secondary winding of said sensing transformer, said first diode enabling charging of said first capacitor during a first portion of an alternating current cycle;
    (e) a second diode and a second capacitor conductively connected in series with said secondary winding of said sensing transformer; said second diode enabling charging of said second capacitor during a second portion of said alternating current cycle; and
    (f) a resistor connected in parallel with said first and said second capacitors.

11. A device for detecting electric current in a power cable comprising:
    (a) a sensing transformer having a secondary winding electromagnetically coupled to said power cable and producing a voltage signal when a current is present in said power cable;
    (b) a diode clamp to control excursions of said voltage signal connected in parallel with said secondary winding and comprising a first diode and a second diode connected with opposing bias;
    (c) a capacitor connected in parallel with said secondary winding and selected to resonate with said secondary winding at an expected frequency of said current in said power cable;
    (d) a voltage amplifier comprising:
       (i) a first amplifier diode and a first amplifier capacitor conductively connected in series with said secondary winding;
       (ii) a second amplifier diode and a second amplifier capacitor connected in series with said secondary winding, said first amplifier capacitor charging during a first half of an alternating current cycle and said second amplifier capacitor charging during a second half of said alternating current cycle to double a magnitude of said voltage signal; and
    (e) a first switch transistor having a first gate, a first drain, and a first source, said first gate and said first source conductively connected to receive said voltage signal; and
    (f) a second switch transistor having a second gate, a second drain, and a second source, said second gate conductively connected to said first gate and said second source connected to said first source, conduction between said first drain and said second drain being enabled by said voltage signal.

12. The device for detecting electric current in a power cable of claim 11 further comprising a resistor connected in parallel with said first and said second amplifier diodes.

13. The device for detecting electric current in a power cable of claim 11 wherein said voltage signal enables conduction between said first drain and said drain when a current of 0.25 amperes is present in said power cable.

14. The device for detecting electric current in a power cable of claim 11 wherein said voltage signal enables conduction between said first drain and said drain when a current of 0.14 amperes is present in said power cable.

* * * * *